(12) United States Patent
Uchino et al.

(10) Patent No.: US 7,605,789 B2
(45) Date of Patent: Oct. 20, 2009

(54) TRANSISTOR CIRCUIT, PIXEL CIRCUIT, DISPLAY DEVICE, AND DRIVING METHOD THEREFOR

(75) Inventors: Katsuhide Uchino, Kanagawa (JP); Junichi Yamashita, Tokyo (JP)

(73) Assignee: Sony Corporation, Tokyo (JP)

( * ) Notice: Subject to any disclaimer, the term of this patent is extended or adjusted under 35 U.S.C. 154(b) by 602 days.

(21) Appl. No.: 10/580,686

(22) PCT Filed: Dec. 2, 2004

(86) PCT No.: PCT/JP2004/018334

§ 371 (c)(1),
(2), (4) Date: May 26, 2006

(87) PCT Pub. No.: WO2005/055184

PCT Pub. Date: Jun. 16, 2005

(65) Prior Publication Data

US 2007/0091029 A1  Apr. 26, 2007

(30) Foreign Application Priority Data

Dec. 2, 2003 (JP) .............................. 2003-402673

(51) Int. Cl.
*G09G 3/12* (2006.01)
*G09G 3/18* (2006.01)
*G09G 3/30* (2006.01)
*G09G 3/36* (2006.01)

(52) U.S. Cl. ............................. 345/92; 345/76; 345/87; 315/169.3

(58) Field of Classification Search ........... 345/55–100, 345/204–214, 690–697; 315/169.3
See application file for complete search history.

(56) References Cited

U.S. PATENT DOCUMENTS 5,670,979 A * 9/1997 Huq et al. .................. 345/100

(Continued)

FOREIGN PATENT DOCUMENTS

EP  1 590 786  11/2005

(Continued)

OTHER PUBLICATIONS

International Search Report mailed Feb. 1, 2005.

(Continued)

*Primary Examiner*—David L Lewis
(74) *Attorney, Agent, or Firm*—Rader, Fishman & Grauer PLLC

(57) ABSTRACT

A transistor circuit having the function of correcting variations in the threshold voltage of a thin-film transistor is provided.

The transistor circuit includes a plurality of thin-film transistors (Tr1 to Tr3) formed on a substrate and wiring which connects the gate, source, and/or drain of each of the transistors, so as to perform a predetermined operation. During the operation, a forward bias is applied between the gate and source of the thin-film transistor (Tr2) via the wiring repeatedly and/or continuously. A reverse bias is applied between the gate and source of the transistor (Tr2) in such timing that the operation is not disturbed so that the variations in the threshold voltage are suppressed. More specifically, an additional transistor (Tr3) connected in parallel to the transistor (Tr2) is driven complementarily, so as to generate the above-described timing where the operation is not disturbed, and the reverse bias is applied to the transistor (Tr2) in the generated timing.

17 Claims, 12 Drawing Sheets

U.S. PATENT DOCUMENTS

| | | | |
|---|---|---|---|
| 6,229,506 B1 * | 5/2001 | Dawson et al. | 345/82 |
| 6,809,482 B2 * | 10/2004 | Koyama | 345/77 |
| 7,277,071 B2 * | 10/2007 | Oh | 345/76 |
| 2002/0195968 A1 | 12/2002 | Sanford et al. | |
| 2003/0016191 A1 | 1/2003 | Nakamura et al. | |
| 2003/0052614 A1 | 3/2003 | Howard | |
| 2003/0095087 A1 | 5/2003 | Libsch et al. | |
| 2004/0217925 A1 * | 11/2004 | Chung et al. | 345/76 |
| 2005/0007316 A1 * | 1/2005 | Akimoto et al. | 345/76 |

FOREIGN PATENT DOCUMENTS

| | | |
|---|---|---|
| JP | 62-118390 | 5/1987 |
| JP | 01-291216 | 11/1989 |
| JP | 08-234683 | 9/1996 |
| JP | 2001-060076 | 3/2001 |
| JP | 2003-173154 | 6/2003 |
| JP | 2003-173165 | 6/2003 |
| JP | 2003-224437 | 8/2003 |
| JP | 2003-263129 | 9/2003 |

OTHER PUBLICATIONS

International Search Opinion mailed Feb. 1, 2005.
Supplementary European Search Report dated Feb. 8, 2008 for Corresponding European Application No. 04 80 1632.
Japanese Office Action dated Jan. 29, 2008 for corresponding Japanese Application No. 2003-402673.

* cited by examiner

FIG. 3
(A)
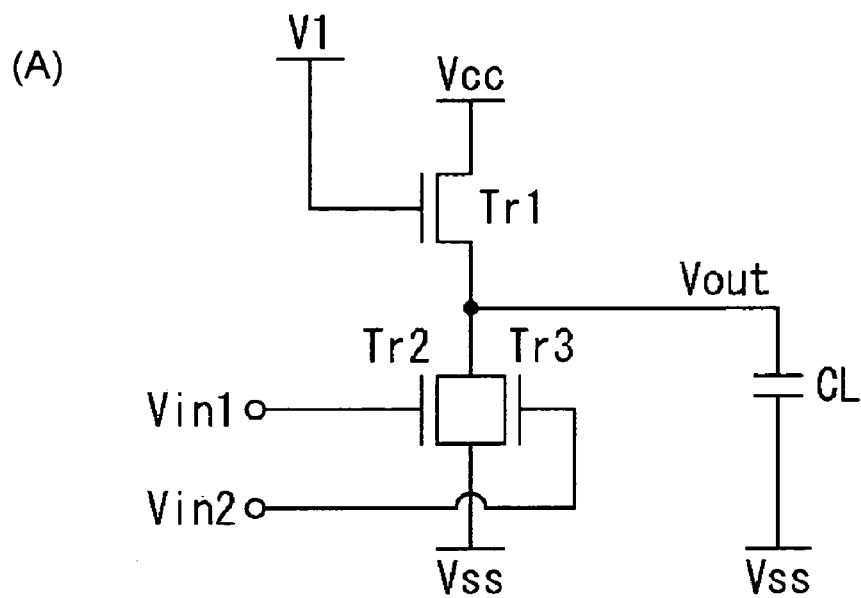
(B)
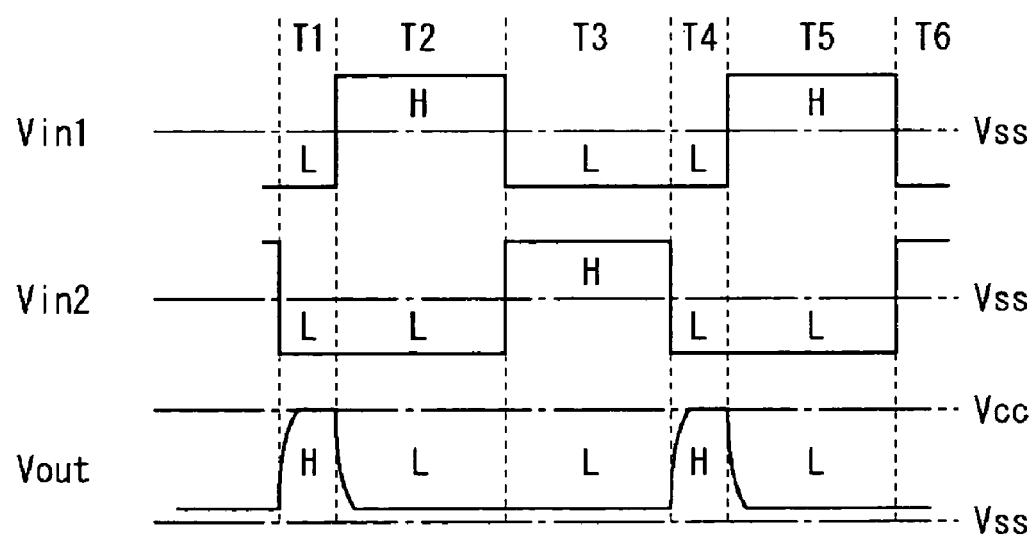

TRANSISTOR CIRCUIT, PIXEL CIRCUIT, DISPLAY DEVICE, AND DRIVING METHOD THEREFOR

TECHNICAL FIELD

The present invention relates to a transistor circuit including thin-film transistors integrally formed on a substrate. Further, the present invention relates to a pixel circuit which is an example of the transistor circuit. Still further, the present invention relates to a display device including the pixel circuits arranged in matrix. The active-matrix display device includes a flat display panel such as a liquid-crystal display and an organic EL display, for example.

BACKGROUND ART

The thin-film transistor which is an example field-effect transistor uses an amorphous silicon film and/or a polycrystalline silicon film formed on an insulation substrate including glass or the like, as an element region. In recent years, the thin-film transistor has been actively developed, as a pixel switch of the active-matrix display device. The thin-film transistor includes a gate, a drain, and a source, and passes a current between the source and the drain according to a voltage applied to the gate. When the thin-film transistor operates in a saturation region, a drain current Ids is provided according to the following transistor-characteristic expression.

$$Ids = (1/2)\mu(W/L)Cox(Vgs-Vth)2$$

Here, Vgs represents the gate voltage with reference to the source, Vth represents a threshold voltage, Cox represents a gate capacitor, W represents a channel width, L represents a channel length, and μ represents the mobility of a semiconductor film. As is clear from the transistor-characteristic expression, when the gate voltage Vgs of the thin-film transistor exceeds the threshold voltage Vth, the drain current Ids is passed.

Several thin-film transistors are connected so that a transistor circuit having a predetermined function is formed. In general, the transistor circuit includes a plurality of thin-film transistors formed on a substrate and wiring adapted to connect the gate, source, and/or drain of each of the transistors, so as to perform a predetermined operation. A pixel circuit is a typical example of the above-described transistor circuit. The pixel circuit is formed at each of intersections of scan lines in rows and signal lines in columns so that the entire pixel circuits form the active-matrix display device. Upon being selected by the scan line, the pixel circuit operates, so as to sample a video signal from the signal line and drive a load element such as an organic EL light-emission element. The above-described active matrix-organic EL-display device including the thin-film transistor, as an active element, is disclosed in Japanese Unexamined Patent Application Publication No. 8-234683, for example.

In the saturation region, when the gate voltage exceeds the threshold voltage, the thin-film transistor is turned on and the drain current is passed, as is clear from the above-described transistor-characteristic expression. On the other hand, when the gate voltage becomes lower than the threshold voltage, the thin-film transistor is cut off. However, the threshold voltage Vth of the thin-film transistor is not necessarily constant but varied with time. Due to the variation in the threshold voltage, the cut-off operation is disturbed, which causes the transistor circuit to malfunction. Further, as is clear from the above-described transistor-characteristic expression, the drain current varies as the threshold value varies, even though the gate voltage is maintained constant. In the case of a pixel circuit configured to drive a light-emission element by a current, the drain current is varied due to the variation in the threshold voltage, so that the brightness of the light-emission element is deteriorated.

DISCLOSURE OF INVENTION

In view of the above-described known technical problems, an object of the present invention is to provide a transistor circuit having the function of correcting variations in the threshold voltage of a thin-film transistor, a pixel circuit, a display device, and a driving method therefor. For achieving the object, the following means is provided. That is to say, a transistor circuit having a plurality of thin-film transistors formed on a substrate and wiring adapted to connect a gate, a source, and/or a drain of each of the thin-film transistors, so as to perform a predetermined operation, is provided. The transistor circuit includes at least one thin-film transistor applied with a forward bias between a gate and a source repeatedly and/or continuously via wiring during the operation, and reverse-bias-application means configured to suppress a variation in a threshold voltage of the thin-film transistor by applying a reverse bias between the gate and source of the thin-film transistor in such timing that the operation is not disturbed.

Preferably, an additional thin-film transistor connected in parallel to the thin-film transistor and complement means which drives the additional thin-film transistor relative to the thin-film transistor, so as to generate timing where the above-described operation is not disturbed, are provided, wherein the reverse-bias-application means applies the reverse bias to the thin-film transistor in the generated timing. For example, the thin-film transistor is of an N-channel type and/or a P-channel type, the additional thin-film transistor is of the N-channel type and/or the P-channel type, similarly, and the complement means applies a pulse to a gate of the additional thin-film transistor, the pulse being opposite in phase to a pulse applied to the gate of the thin-film transistor. On the other hand, the thin-film transistor is of an N-channel type and/or a P-channel type, the additional thin-film transistor is of the P-channel type and/or the N-channel type, oppositely, and the complement means applies a pulse to the additional thin-film transistor, the pulse being in phase with a pulse applied to the gate of the thin-film transistor.

Further, the present invention provides a pixel circuit that is provided at each of intersections of scan lines in rows and scan lines in columns, and that samples a signal from the signal line upon being selected by the scan line and drives a load element according to the sampled signal. The pixel circuit includes a plurality of thin-film transistors formed on a substrate and wiring adapted to connect a gate, a source and/or a drain of each of the thin-film transistors, at least one thin-film transistor applied with a forward bias between a gate and a source repeatedly and/or continuously via wiring while the load element is driven, and reverse-bias-application means configured to suppress a variation in a threshold voltage of the thin-film transistor by applying a reverse bias between the gate and source of the thin-film transistor in such timing that the driven load element is not disturbed.

Preferably, an additional thin-film transistor connected in parallel to the thin-film transistor and complement means which operates the additional thin-film transistor complementarily relative to the thin-film transistor and generates timing where the above-described driven load element is not disturbed are provided. The reverse-bias-application means applies the reverse bias to the thin-film transistor in the generated timing. For example, the thin-film transistor is of an N-channel type and/or a P-channel type, the additional thin-film transistor is of the N-channel type and/or the P-channel type, similarly, and the complement means applies a pulse to a gate of the additional thin-film transistor, the pulse being opposite in phase to a pulse applied to the gate of the thin-film transistor. On the other hand, the thin-film transistor is of an N-channel type and/or a P-channel type, the additional thin-film transistor is of the P-channel type and/or the N-channel type, oppositely, and the complement means applies a pulse to the additional thin-film transistor, the pulse being in phase with a pulse applied to the gate of the thin-film transistor.

Preferably, the plurality of thin-film transistors includes a sampling thin-film transistor that is brought into conduction upon being selected by the scan line, and that samples a signal from the signal line and holds the sampled signal in a holding capacitor, a drive thin-film transistor which controls the amount of power applied to the load element according to the potential of the signal held in the holding capacitor, and a switching thin-film transistor which performs on/off control of the amount of power applied to the load element, wherein the reverse-bias-application means applies the reverse bias to at least one of the drive thin-film transistor and the switching thin-film transistor. Further, threshold voltage-cancellation means is included, the threshold voltage-cancellation means being configured to adjust the level of a signal potential applied to a gate of the drive thin-film transistor, so as to cancel a variation in a threshold voltage of the drive thin-film transistor. Further, bootstrap means is included, the bootstrap means being configured to automatically control the level of a signal potential applied to a gate of the drive thin-film transistor, so as to accommodate a variation in the characteristic of the load element.

Further, the present invention provides a display device including scan lines in rows, scan lines in columns, and pixel circuits provided at intersections of the scan lines, wherein, upon being selected by the scan line, the pixel circuit samples a video signal from the signal line and drives a light-emission element according to the sampled video signal. The pixel circuit includes a plurality of thin-film transistors formed on a substrate, wiring adapted to connect a gate, a source, and/or a drain of each of the thin-film transistors, at least one thin-film transistor applied with a forward bias between a gate and a source repeatedly and/or continuously via wiring while the light-emission element is driven, and reverse-bias-application means configured to suppress a variation in a threshold voltage of the thin-film transistor by applying a reverse bias between the gate and source of the thin-film transistor in such timing that the driven light-emission element is not disturbed.

Preferably, an additional thin-film transistor connected in parallel to the thin-film transistor and complement means are provided, the complement means being configured to operate the additional thin-film transistor complementarily relative to the thin-film transistor and generate timing where the driven light-emission element is not disturbed, wherein the reverse-bias-application means applies the reverse bias to the thin-film transistor in the generated timing. For example, the thin-film transistor is of an N-channel type and/or a P-channel type, the additional thin-film transistor is of the N-channel type and/or the P-channel type, similarly, and the complement means applies a pulse to a gate of the additional thin-film transistor, the pulse being opposite in phase to a pulse applied to the gate of the thin-film transistor. On the other hand, the thin-film transistor is of an N-channel type and/or a P-channel type, the additional thin-film transistor is of the P-channel type and/or the N-channel type, oppositely, and the complement means applies a pulse to the additional thin-film transistor, the pulse being in phase with a pulse applied to the gate of the thin-film transistor.

Preferably, the plurality of thin-film transistors includes a sampling thin-film transistor that is brought into conduction upon being selected by the scan line, and that samples a video signal from the signal line and holds the sampled video signal in a holding capacitor, a drive thin-film transistor which controls the amount of power applied to the light-emission element according to the potential of the signal held in the holding capacitor, and a switching thin-film transistor which performs on/off control of the amount of power applied to the light-emission element, wherein the reverse-bias-application means applies the reverse bias to at least one of the drive thin-film transistor and the switching thin-film transistor. Further, threshold voltage-cancellation means is included, the threshold voltage-cancellation means being configured to adjust the level of a signal potential applied to a gate of the drive thin-film transistor, so as to cancel a variation in a threshold voltage of the drive thin-film transistor. Still further, bootstrap means is included, the bootstrap means being configured to automatically control the level of a signal potential applied to a gate of the drive thin-film transistor, so as to accommodate a variation in the characteristic of the load element.

Further, the present invention provides a method of driving a transistor circuit including a plurality of thin-film transistors formed on a substrate and wiring adapted to connect a gate, a source, and/or a drain of each of the thin-film transistors, so as to perform a predetermined operation. The driving method is adapted to perform a forward bias-application step adapted to apply a forward bias between the gate and the source of at least one of the thin film transistors repeatedly and/or continuously via the wiring during the operation, and a reverse bias-application step adapted to suppress a variation in a threshold voltage of the thin-film transistor by applying a reverse bias between the gate and source of the thin-film transistor in such timing that the operation is not disturbed. Further, a complement step is included, the complement step being adapted to drive an additional thin-film transistor connected in parallel to the thin-film transistor complementarily relative to the thin-film transistor, thereby generating timing where the operation is not disturbed, wherein the reverse bias-application step is adapted to apply the reverse bias to the thin-film transistor in the generated timing.

Further, the present invention provides a method of driving a pixel circuit that is provided at each of intersections of scan lines in rows and scan lines in columns, and that includes a plurality of thin-film transistors formed on a substrate and wiring adapted to connect a gate, a source, and/or a drain of each of the thin-film transistors, so as to sample a signal from the signal line upon being selected by the scan line and drive a load element according to the sampled signal. The driving method is adapted to perform a forward bias-application step adapted to apply a forward bias between the gate and the source of at least one of the thin film transistors repeatedly and/or continuously via the wiring while the load element is driven, and a reverse bias-application step adapted to suppress a variation in a threshold voltage of the thin-film transistor by applying a reverse bias between the gate and source of the thin-film transistor in such timing that the driven load element is not disturbed. Further, a complement step is included, the complement step being adapted to operate an additional thin-film transistor connected in parallel to the thin-film transistor complementarily relative to the thin-film transistor, thereby generating timing where the driven load element is not disturbed, wherein the reverse bias-application step is adapted to apply the reverse bias to the thin-film transistor in the generated timing.

Further, the present invention provides a method of driving a display device comprising scan lines in rows, scan lines in columns, and pixel circuits provided at intersections of the scan lines, wherein, upon being selected by the scan line, the pixel circuit samples a video signal from the signal line and drives a light-emission element according to the sampled video signal, and wherein the pixel circuit includes a plurality of thin-film transistors formed on a substrate and wiring adapted to connect a gate, a source, and/or a drain of each of the thin-film transistors. The driving method is adapted to perform a forward bias-application step adapted to apply a forward bias between the gate and the source of at least one of the thin-film transistors repeatedly and/or continuously via the wiring while the light-emission element is driven, and a reverse bias-application step adapted to suppress a variation in a threshold voltage of the thin-film transistor by applying a reverse bias between the gate and source of the thin-film transistor in such timing that the driven light-emission element is not disturbed. Further, a complement step is included, the complement step being adapted to operate an additional thin-film transistor connected in parallel to the thin-film transistor complementarily relative to the thin-film transistor, thereby generating timing where the driven light-emission element is not disturbed, wherein the reverse bias-application step is adapted to apply the reverse bias to the thin-film transistor in the generated timing.

BRIEF DESCRIPTION OF THE DRAWINGS

FIG. 3 shows schematic diagrams showing a transistor circuit according to a second embodiment of the present invention.

BEST MODE FOR CARRYING OUT THE INVENTION

Figure 1A:
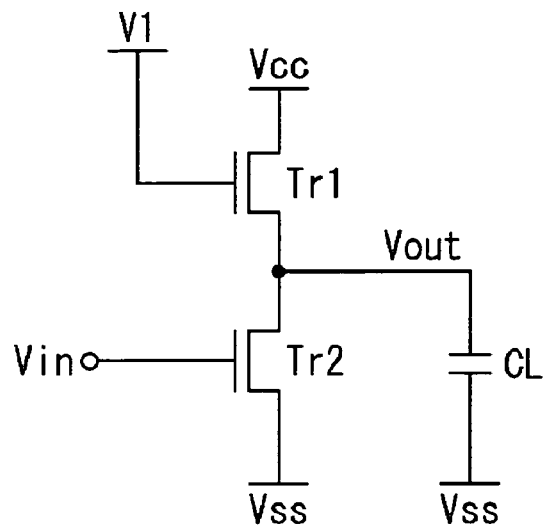
FIGS. 1A to 1C are schematic diagrams showing a transistor circuit according to a first embodiment of the present invention.
Figure 1B:
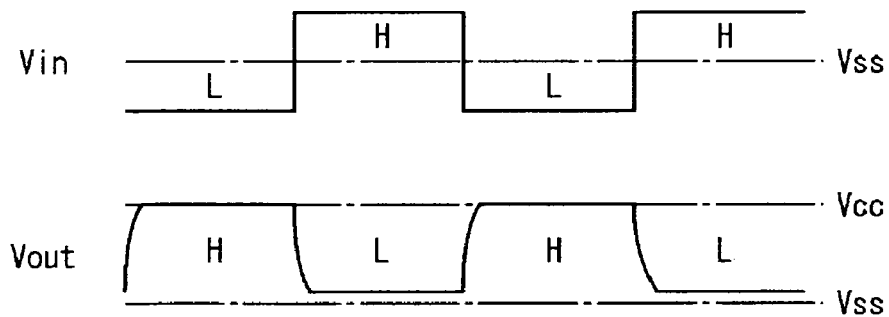
Figure 1C:
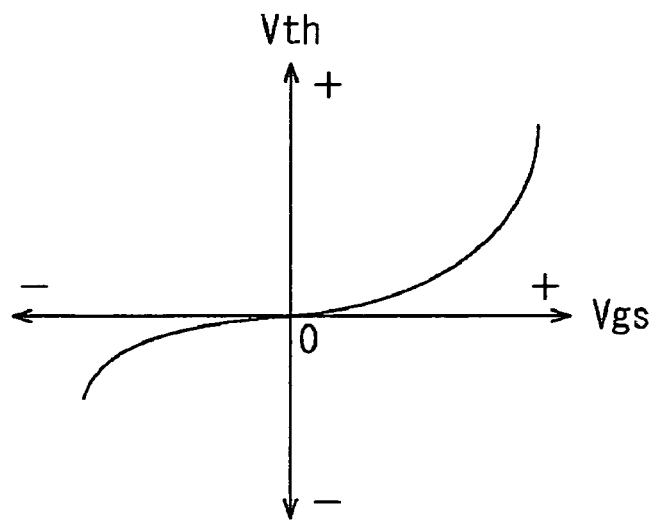

Hereinafter, embodiments of the present invention will be described in detail with reference to the attached drawings. FIGS. 1A to 1C show a transistor circuit according to a first embodiment of the present invention. FIG. 1A is a circuit diagram showing the structure, FIG. 1B is a timing chart showing the operations, and FIG. 1C is a graph showing the principles. As shown in FIGS. 1A, the transistor circuit includes two thin-film transistors Tr1 and Tr2 formed on a substrate, and wiring provided for connecting the gates, sources, and drains of the thin-film transistors Tr1 and Tr2, so as to perform inverter operations. That is to say, the transistor circuit is forms an inverter by using two N-channel transistors Tr1 and Tr2. Since the N-channel thin-film transistor can be produced at low cost by using an amorphous silicon film, as an active layer, the N-channel thin-film transistor has a cost advantage. Here, the inverter is shown, as merely an example, and it is essential only that the transistor circuit relating to the present invention include the thin-film transistors irrespective of the functions and operations thereof.

Specifically, according to the circuit configuration, a predetermined gate voltage V1 is applied to the gate of the transistor Tr1, the drain is applied with a power voltage Vcc and the source transmits an output Vout. In the drawing, a load capacity CL is connected to an output end. The output Vout is applied to one end of the load capacity CL and the other end is grounded on Vss. Since the gate voltage V1 is set, so as to be greater than the sum of a threshold voltage of the transistor Tr1 and the power voltage Vcc, the transistor Tr1 is turned on at all times. An input signal Vin is applied to the gate of the transistor Tr2, the source is grounded on Vss, and the drain is connected to the source of the transistor Tr1, whereby an output node is generated.

Since the transistor circuit performs an inverter operation, as shown in FIG. 1B, the input signal Vin is reversed and the output signal Vout is obtained. That is to say, when the input signal Vin is at a low level (L), the output signal Vout is at a high level (H). When the input signal Vin is at the level H, the output signal Vout is at the level L. As for the transistor Tr2, when the input signal Vin is at the low level, the transistor Tr2 is turned off so that the output node is detached from the ground potential Vss. Since the transistor Tr1 is turned on at all times, the output node is pulled up to the power voltage Vcc. As a result, the level of the output Vout becomes high (Vcc). Conversely, when the input signal Vin is at the high level, the transistor Tr2 is turned on, and the output node is pulled down toward the ground potential Vss. When the sum of a current discharged from the load capacity CL and a current transmitted from the transistor Tr1 becomes proportional to a current flowing through the transistor Tr2, the output Vout is determined to be at the low level. Usually, the Vout at the low level is a little higher than the ground potential Vss.

As is clear from the description above, the input signal Vin at the low level should be lower than the threshold voltage of the transistor Tr2 and is usually set to the ground potential Vss. On the other hand, the input signal Vin at the high level should be sufficiently higher than the threshold voltage of the transistor Tr2. However, according to the above-described ordinary settings, a high-level forward bias is repeatedly applied to the gate of the transistor Tr2, which causes an upward variation in the threshold voltage of the transistor Tr2. If the upward variation is allowed to continue unaddressed, the input signal Vin at the high level may become lower than the threshold voltage which is varied upward, which becomes the cause of a malfunction. Therefore, according to the present invention, the input signal Vin at the low level is applied to the transistor Tr2 at regular time intervals, as a negative potential lower than the ground potential Vss, that is, a reverse bias. The threshold voltage which is shifted upward is revised downward by the reverse bias. As a result, variations in the threshold voltage of the transistor Tr2 can be suppressed. That is to say, according to the first embodiment, the source of the input signal Vin forms reverse-bias application means and applies a reverse bias between the gate and source of the thin-film transistor Tr2 in such timing that the inverter operation is not disturbed (low-level timing in the drawing), so as to suppress the variations in the threshold voltage of the thin-film transistor Tr2.

FIG. 1C is a graph showing variations in the threshold voltage of the thin-film transistor Tr2. The horizontal axis shows a gate voltage Vgs relative to the source potential and the vertical axis shows a threshold voltage Vth. When a gate voltage which is always positive (forward bias) is applied repeatedly and/or continuously, the threshold voltage Vth is varied upward. When the upward variation has gone too far, a normal on/off operation cannot be performed. Conversely, when a negative gate voltage (reverse bias) is applied continuously, the threshold voltage Vth is varied downward. The present invention uses the above-described phenomenon, that is to say, the upward-shifted threshold voltage obtained by the continuous application of the forward bias is revised downward by applying the reverse bias in such timing that the operation of the circuit is not disturbed so that the variations in the threshold voltage are suppressed.

Figure 2:
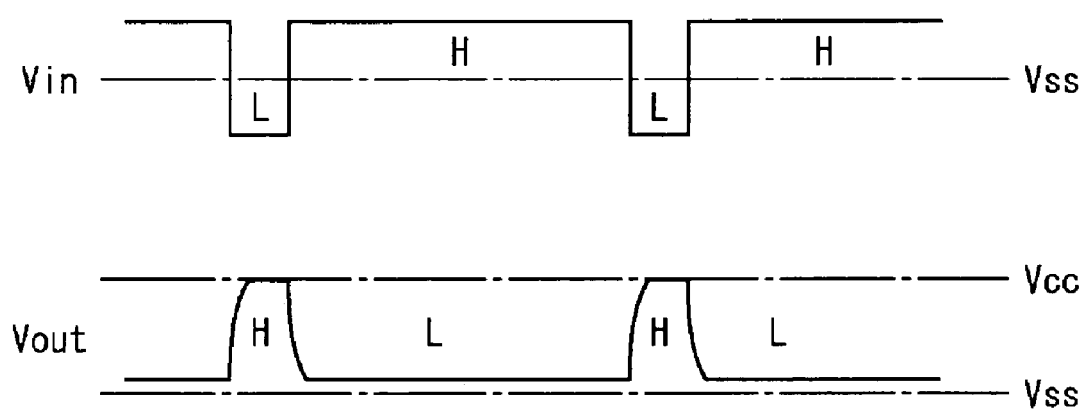
FIG. 2 is a timing chart provided for illustrating operations of the transistor circuit shown in FIG. 1A.

FIG. 2 is a timing chart showing an input signal Vin and an output signal Vout according to another embodiment, the input signal Vin and the output signal Vout being provided for the transistor circuit shown in FIG. 1A. In this embodiment, the duty of an input pulse Vin deviates from 50%, and a low-level period is short and a high-level period is long. Conversely, in the case of an output pulse Vout obtained by reversing the input pulse Vin, a high-level period is short and a low-level period is long. According to the operation state of a circuit block including the inverter, the above-described input signal Vin may be used.

In this embodiment, the reverse bias (low level) is applied during intervals between the forward biases applied to the gate of the transistor Tr2. However, since the reverse-bias application time is short, a sufficient threshold-voltage-variation suppression advantage is not necessarily obtained. That is to say, since the upward variations in the threshold voltage is significant, the upward variations being caused by the continuous change in the forward bias (high level), the downward-revision advantage achieved by using the reverse bias often does not keep up with the upward variations. However, when compared to the case where the reverse bias is not added, it is clear that a predetermined threshold-voltage-variation suppression advantage can be obtained.

FIG. 3 is a schematic diagram showing a transistor circuit according to a second embodiment of the present invention. FIG. 3(A) is a circuit diagram showing the configuration and FIG. 3(B) is a timing chart showing the operations. For the sake of clarity, the part corresponding to the first embodiment shown in FIGS. 1A and 1B is designated by the corresponding reference numeral. This embodiment is achieved by improving the embodiment shown in FIG. 1. Particularly, as has been described with reference to FIG. 2, an object of this embodiment is to cope with the case where a sufficient reverse-bias-application time period cannot be ensured.

As shown in FIG. 3(A), an additional thin-film transistor Tr3 is connected in parallel to the transistor Tr2 which is a subject. An input signal Vin1 is applied to the gate of the transistor Tr2. As described above, a signal source of the input signal Vin1 forms the reverse-bias-application means at the same time. On the other hand, another input signal Vin2 is applied to the gate of the additional transistor Tr3. The signal source of the input signal Vin2 forms complement means which is a feature element of this embodiment. That is to say, the complement means drives the additional transistor Tr3 complementarily relative to the transistor Tr2 so that the timing where the operations of the transistor Tr2 are not disturbed is forcefully generated. The reverse-bias-application means applies the reverse bias to the thin-film transistor Tr2 in the forcefully generated timing so that the variations in the threshold voltage of the transistor Tr2 are suppressed.

In this embodiment, the transistor Tr2 is of the N-channel type and the additional transistor Tr3 is of the same N-channel type. In that case, the complement means applies a signal pulse Vin2 to the gate of the additional transistor Tr3, the signal pulse Vin2 being opposite in phase to the signal pulse Vin1 applied to the transistor Tr2. When the transistors Tr2 and Tr3 are of the P-channel type, the signal pulses Vin1 and Vin2 are opposite in phase to each other. On the other hand, when one of the transistors Tr2 and Tr3 is of the N-channel type and the other is of the P-channel type, the signal pulses Vin1 and Vin2 are in phase.

Next, the operations of a transistor circuit shown in FIG. 3(A) will be described with reference to FIG. 3(B). In timing T1, the level of the signal pulse Vin1 becomes low and that of the signal Vin2 also becomes low. At that time, both the transistors Tr2 and Tr3 connected in parallel to each other are turned off. Therefore, the output node is pulled up to the VCC side by the transistor Tr1. As a result, the level of the output signal Vout becomes high. In the next timing T2, the signal pulse Vin1 is shifted so that the level thereof becomes high and the signal pulse Vin2 is maintained at the low level. Since one of the transistors Tr2 and Tr3 that are connected in parallel to each other, that is, the transistor Tr2 is turned on, the output node is pulled down to the Vss side. As a result, the output signal Vout is shifted so that the level thereof becomes low. On the contrary, in the next timing T3, the signal pulse Vin1 is changed so that the level thereof becomes low and the signal pulse Vin2 is changed so that the level thereof becomes high. Subsequently, since one of the transistors Tr2 and Tr3 that are connected in parallel to each other, that is, the transistor Tr3 is turned on, the output node is further pulled down toward the Vss side. Therefore, the output signal Vout is maintained at the low level. Therefore, a single period of input and output signals comes to an end and a change to the next period is made.

As is clear from the comparison of the signal pulses Vin1 and Vin2, both the signals are opposite in phase to each other in the timing T2 and the timing T3. Particularly, in timing T3, the transistor Tr2 is turned off and brought to a non-operation state. On the other hand, the transistor Tr3 is turned on and brought to an operation state so that the transistor Tr2 in the non-operation state is place of the transistor Tr2, the output node is further pulled down toward the Vss side and the output signal Vout which is a target can be obtained. The complement function of the transistor Tr3 generates the timing T3 where the operations of the transistor Tr2 are not disturbed. Reverse-bias-application means which is the source of the signal pulse Vin1 applies a reverse bias to the transistor Tr2 in the generated timing T3. As is clear from the timing chart, a time period T2 over which the forward bias is applied is roughly proportional to a time period T1+T3 over which a reverse bias is applied. Therefore, it becomes possible to revise the upward variations in the threshold voltage downward, as required.

Figure 4A:
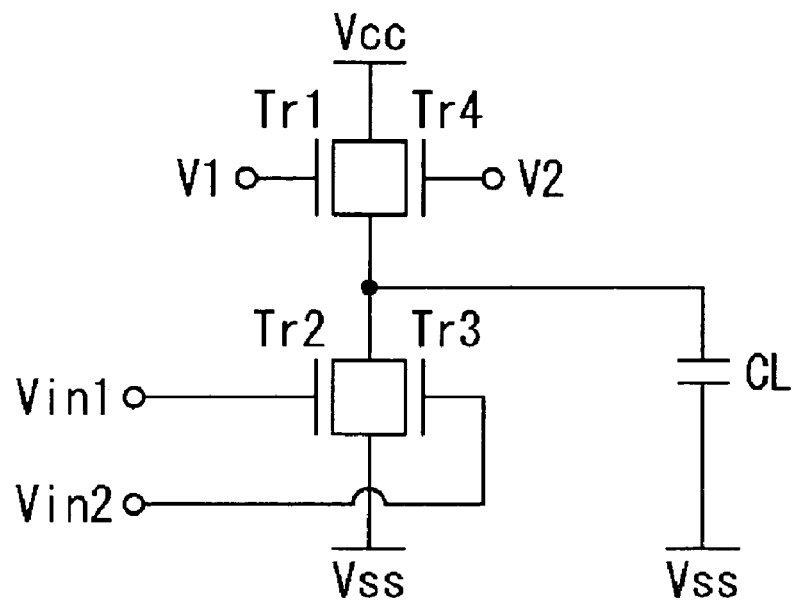
FIGS. 4A and 4B are schematic diagrams showing a transistor circuit according to a third embodiment of the present invention.
Figure 4B:
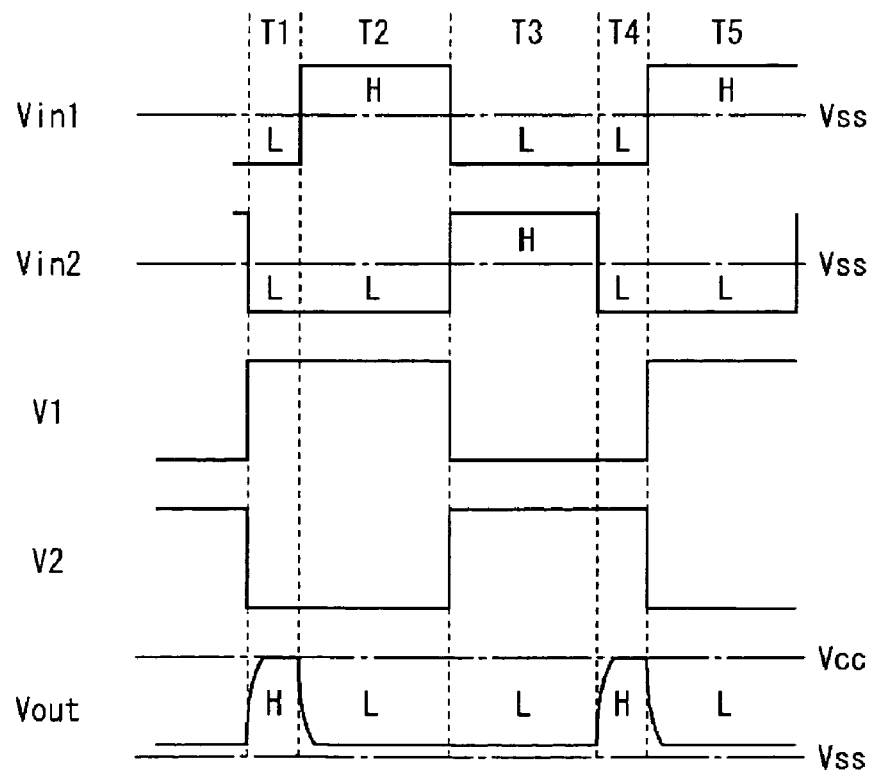

FIGS. 4A and 4B show a transistor circuit according a third embodiment achieved by improving the second embodiment shown in FIG. 3. FIG. 4A is a circuit diagram showing the configuration of this embodiment and FIG. 4B is a timing chart showing the operations.

When the inverter circuit includes the transistors Tr1 and Tr2, both the transistors being of the N-channel type, the transistor Tr1 is kept in an operation state at all times. In other words, the transistor Tr1 is in the state of being applied with a forward bias at all times and the threshold voltage is shifted upward with time. When the upward shift has gone too far, normal operations are often disturbed. Therefore, in this embodiment, a complement transistor Tr4 is also connected in parallel to the transistor Tr1.

As shown in FIG. 4B, in the timing T1 and the timing T2, a gate voltage v1 for the transistor Tr1 is at a high level and a gate voltage V2 for the transistor Tr4 is at a low level. On the contrary, in the timing T3 and the timing T4, the gate voltage V1 is changed so that the level thereof becomes low and the level of the gate voltage V2 becomes high. Subsequently, the transistors Tr1 and Tr4 operate complementarily for each other and an entire switch including the pair of the transistors Tr1 and Tr4 is maintained at the on state at all times. At that time, one of the gate voltages, that is, the gate voltage V1 is at the low level in the timing T3 and the timing T4, which makes it possible to apply a reverse bias, so as to correct the threshold value. On the other hand, since the gate voltage V2 is at the low level in the timing T1 and the timing T2, it becomes also possible to apply a reverse bias to the transistor Tr4, so as to suppress variations in the threshold voltage.

Figure 5:
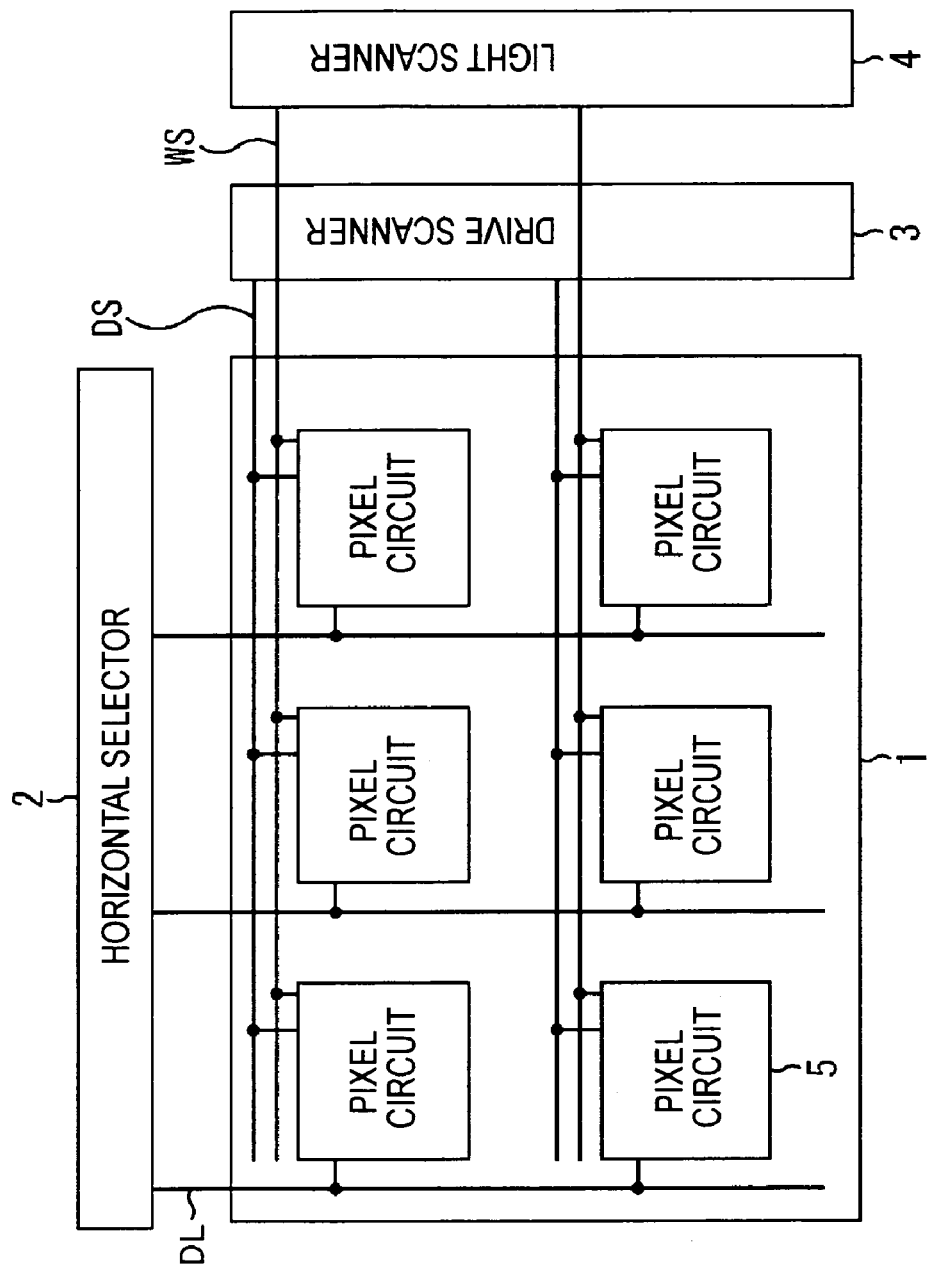
FIG. 5 is a block diagram showing an overview of an active-matrix display device relating to the present invention and pixel circuits included therein.

FIG. 5 is a block diagram schematically showing an active-matrix display device which is an example application for the transistor circuit relating to the present invention and pixel circuits included therein. As shown in the drawing, the active-matrix display device includes a pixel array 1 functioning as main part and a group of peripheral circuits. The peripheral-circuit group includes a horizontal selector 2, a drive scanner 3, a light scanner 4, and so forth.

The pixel array 1 includes scan lines WS in rows, signal lines DL in columns, and the pixel circuits 5 arranged in matrix, where the pixel circuits 5 are provided at intersections of the scan lines WS and the signal lines DL. The signal line DL is driven by the horizontal selector 2. The scan line WS is scanned by the light scanner 4. Further, other scan lines DS are also provided, so as to be parallel to the scan lines WS, and scanned by the drive scanner 3. Upon being selected by the scan line WS, the pixel circuit 5 samples a signal from the signal line DL. Further, upon being selected by the scan line DS, the pixel circuit 5 drives a load element according to the sampled signal. The above-described load element includes a current-driven light-emission element formed in each of the pixel circuit 5, for example.

Figure 6:
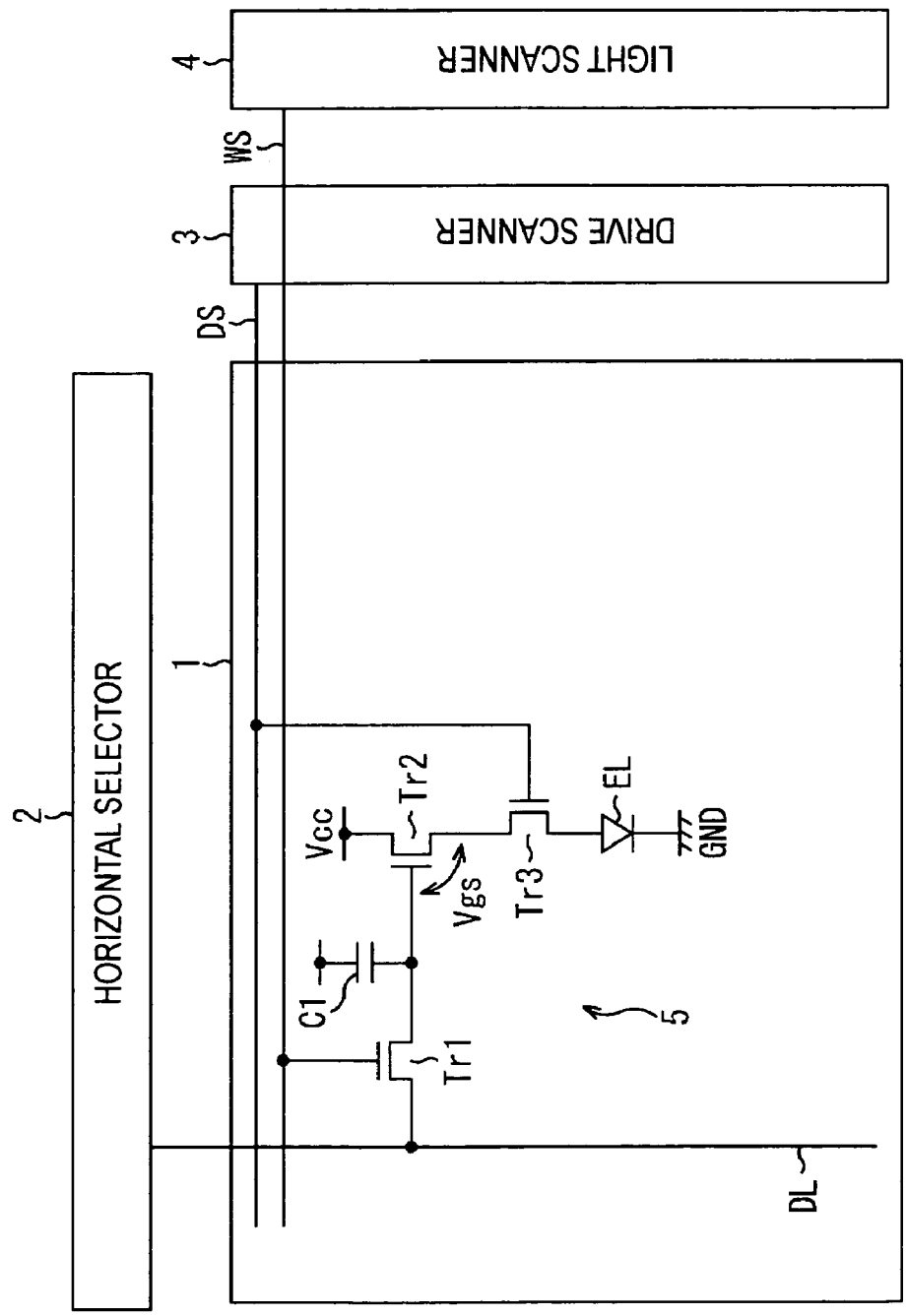
FIG. 6 is a block diagram showing an example pixel circuit.

FIG. 6 is a reference drawing showing the basic configuration of the pixel circuit 5 shown in FIG. 5. The pixel circuit 5 includes a sampling thin-film transistor (sampling transistor Tr1), a drive thin-film transistor (drive transistor Tr2), a switching thin-film transistor (switching transistor Tr3), a holding capacitor C1, a load element (organic EL light-emission element), and so forth.

Upon being selected by the scan line WS, the sampling transistor Tr1 is brought into conduction. Further, the sampling transistor Tr1 samples a video signal from the signal line DL and stores the sampled video signal into the holding capacitor C1. The drive transistor Tr2 controls the amount of power applied to the light-emission element EL according to the potential of the signal held in the holding capacitor C1. The switching transistor Tr3 is controlled by the scan line DS and turns the power applied to the light-emission element EL on/off. That is to say, the drive transistor Tr2 controls the light-emission brightness (luminosity) of the light-emission element EL according to the power amount. On the other hand, the switching transistor Tr3 controls the light-emission time of the light-emission element EL. Due to the above-described control performed by the transistors, the light-emission element EL included in each of the pixel circuits 5 offers the brightness corresponding to the video signal and a desired display image is produced on the pixel array 1.

Figure 7:
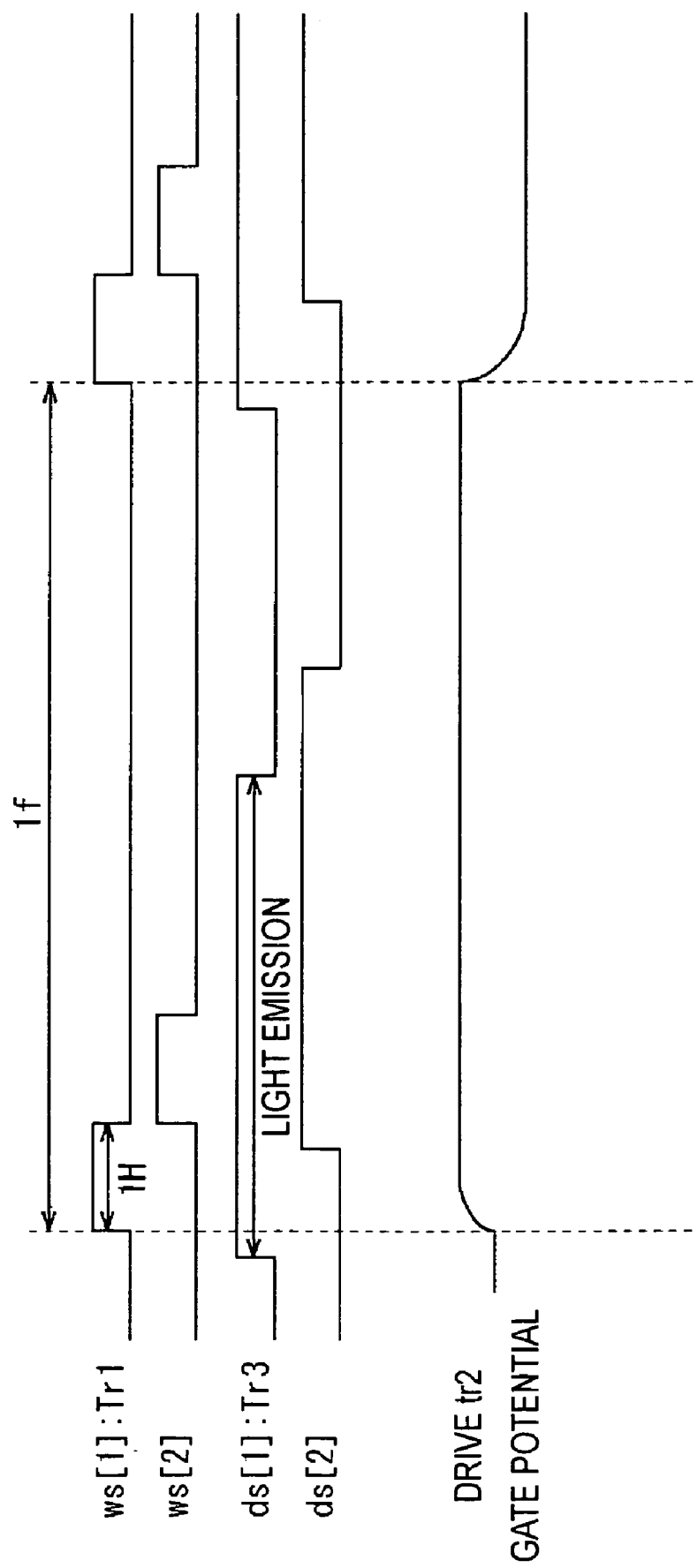
FIG. 7 is a timing chart provided, so as to illustrate operations of the pixel circuit shown in FIG. 6.

FIG. 7 is a timing chart provided for illustrating operations of the pixel array 1 and the pixel circuits 5 that are shown in FIG. 6. At the head of a single-field period (1$f$), a selection pulse ws [1] is applied to the pixel circuit 5 of the first row via the scan line WS during a single horizontal period (1H) and the sampling transistor Tr1 is brought into conduction. Subsequently, the video signal is sampled from the signal line DL and written into the holding capacitor C1. One end of the holding capacitor C1 is connected to the gate of the drive transistor Tr2. Therefore, when the video signal is written into the holding capacitor C1, the gate potential of the drive transistor Tr2 increases according to the written signal potential. At that time, a selection pulse ds [1] is applied to the switching transistor Tr3 via another scan line DS. During the application, the light-emission element EL keeps on emitting light. Since the level of the selection pulse ds [1] becomes low in the latter half of the single-field period 1$f$, the light-emission element EL enters the non-light-emission state. The ratio of the light-emission period and the non-light-emission period can be adjusted by adjusting the duty of the pulse ds [1], so that desired screen brightness can be obtained. When a shift to the next horizontal period is made, signal pulses ws [2] and ds [2] that are used for scanning are applied from the scan lines WS and DS to the second pixel circuit, respectively.

Here, returning to FIG. 6, problems of the pixel circuit 5 shown as the reference example will be described. In the pixel circuit 5 shown as the reference example, each of the transistors Tr1 to Tr3 includes a thin-film transistor of the N-channel type so that an amorphous silicon film which is advantageous in terms of cost can be used, as an active layer. However, the drain of the drive transistor Tr2 is connected to the power voltage Vcc, and the source is connected to the anode of the light-emission element EL via the switching transistor Tr3. Subsequently, the transistor Tr2 becomes a so-called source follower, which raises a problem. The signal voltage held in the holding capacitor C1 is applied to the gate of the transistor Tr2 and is maintained constant in principle. However, the source potential varies as the current/voltage characteristic of the light-emission element EL changes over time. In general, the anode potential increases as the light-emission element EL deteriorates over time, so that the source potential also increases. The drive transistor Tr2 operates in a saturation region and a drain current Ids is dependent on the gate potential Vgs relative to the source potential, as shown by the above-described transistor-characteristic expression. Since the transistor Tr2 operates, as the source follower, even though the gate voltage itself is maintained constant, the source potential varies due to the characteristic deterioration of the light-emission element EL and the gate potential Vgs changes corresponding thereto. Therefore, the drain current Ids varies so that the brightness of the light-emission element EL is deteriorated, which raises another problem.

Further, the drive transistor Tr2 in itself has variations in the threshold voltage Vth. As is clear from the above-described transistor-characteristic expression, if the gate potential Vgs is maintained constant when the drive transistor Tr2 operates in the saturation region, the drain current IDS changes as the threshold voltage Vth varies, and the brightness of the light-emission element EL changes according to the variation. Particularly, since there are significant variations with time in the threshold voltage of the thin-film transistor including the amorphous silicon film, as the active layer (channel region), it is impossible to control the brightness of the light-emission element correctly without accommodating the variations.

Figure 8:
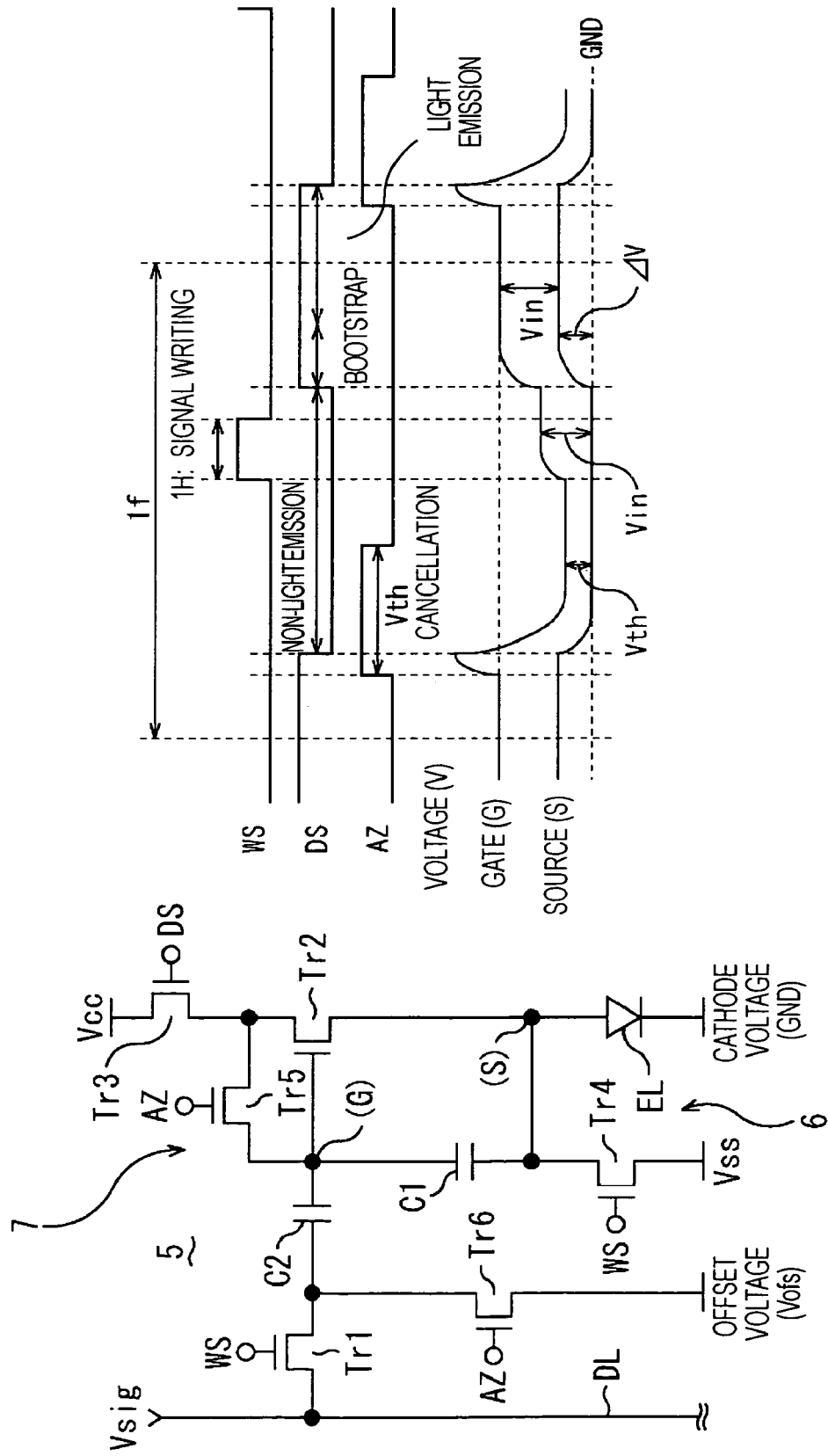
FIGS. 8A and 8B are schematic diagrams showing another example pixel circuit.

FIGS. 8A and 8B show a pixel circuit relating to another reference example obtained by improving the pixel circuit shown in FIG. 6. FIG. 8A is a circuit diagram showing the configuration and FIG. 8B is a timing chart showing the operations.

According to the configuration of the improved example, a bootstrap circuit 6 and a threshold-voltage cancellation circuit 7 are added to the pixel circuit shown in FIG. 6, as shown in FIG. 8A. The bootstrap circuit 6 is adapted to automatically control the level of the signal potential applied to a gate (G) of the drive transistor Tr2, so as to accommodate variations in the characteristic of the light-emission element EL. The bootstrap circuit 6 includes a switching transistor Tr4. The scan line WS is connected to the gate of the switching transistor Tr4, the source is connected to the power potential Vss, and the drain is connected to one end of the holding capacitor C1 and connected to the source (S) of the drive transistor Tr2. When a selection pulse is applied to the scan line WS, the sampling transistor Tr1 is turned on and the switching transistor Tr4 is turned on. Accordingly, a video signal Vsig is written into the holding capacitor C1 via a coupling capacitor C2. When the selection pulse is cancelled from the scan line WS, the switching transistor Tr4 is turned off. Subsequently, the holding capacitor C1 is detached from the power potential Vss and coupled to the source (S) of the drive transistor Tr2. When the selection pulse is applied to the scan line DS after that, the switching transistor Tr3 is turned on and a drive current is transmitted to the light-emission element EL through the drive transistor Tr2. The light-emission element EL starts emitting light, and the anode potential increases according to the current/voltage characteristic thereof so that the source potential of the drive transistor Tr2 increases. At that time, since the holding capacitor C1 is detached from the power potential Vss, the signal potential that had been held increases (bootstraps) as the source potential increases, so that the potential of the gate (G) of the drive transistor Tr2 increases. That is to say, even though the characteristic of the light-emission element EL varies, the gate voltage Vgs of the drive transistor Tr2 agrees with the net signal potential held in the holding capacitor C1 at all times. Due to the above-described bootstrap operations, the drain current of the drive transistor Tr2 is maintained constant at all times by the signal potential held in the holding capacitor C1 and the brightness of the light-emission element EL does not change, even though the characteristic of the light-emission element EL varies. By adding the above-described bootstrap means 6, the drive transistor Tr2 can function, as a constant-current power supply which operates with precision for the light-emission element EL.

The threshold-voltage cancellation circuit 7 adjusts the level of the signal potential applied to the gate (G) of the drive transistor Tr2, so as to cancel the variations in the threshold voltage of the drive transistor Tr2, and includes the switching transistors Tr5 and Tr6. The gate of the switching transistor Tr5 is connected to another scan line AZ and the drain/source is connected between the gate and drain of the drive transistor Tr2. The gate of the switching transistor Tr6 is also connected to the scan line AZ, the source is connected to a predetermined off-set voltage Vofs, and the drain is connected to one of electrodes of the coupling capacitor C2. Further, in the drawing, the off-set voltage Vofs, the power potential Vss, and a cathode voltage (GND) may have potentials that are different from one another. However, all of the potentials may be set to a common potential (e.g., GND), as required.

When a control pulse is applied to the scan line AZ, the switching transistor Tr5 is brought into conduction and a current flows from the Vcc side toward the gate of the drive transistor Tr2, so that the gate (G) potential increases. Subsequently, a drain current starts flowing into the drive transistor Tr2 and the potential of the source (S) increases. Exactly when the potential difference Vgs between the gate potential (G) and the source potential (S) agrees with the threshold voltage Vth of the drive transistor Tr2, the drain current stops flowing according to the above-described transistor-characteristic expression. The voltage Vgs between the source and the gate at that time is written into the holding capacitor C1, as the threshold voltage Vth of the transistor Tr2. Since the threshold voltage Vth written into the holding capacitor C1 is applied to the gate of the drive transistor Tr2 in addition to the signal potential Vsig, the advantage of the threshold voltage Vth is cancelled. Therefore, even though the threshold voltage Vth of the drive transistor Tr2 varies with time, the threshold-voltage cancellation circuit 7 can cancel the variations.

FIG. 8B is a timing chart showing the waveforms of scan pulses applied to the scan lines WS, DS, and AZ and the waveforms of potentials of the gate (G) and the source (S) of the drive transistor Tr2. As shown in the drawing, when in a Vth-cancellation period, the pulse is applied to the scan line AZ, the switching transistor Tr5 is brought into conduction, and the gate potential of the transistor Tr2 increases. After that, since the pulse of the scan line DS falls, the current transmission from the power VCC-side is stopped. Subsequently, the difference between the gate potential and the source potential reduces, and when the difference corresponds to the threshold voltage Vth, the current value becomes zero. As a result, the threshold voltage Vth is written into the holding capacitor C1 connected between the gate and source of the transistor Tr2. Next, when the selection pulse is applied to the next scan line WS, the sampling transistor Tr1 is turned on and the signal Vsig is written into the holding capacitor C1 via the coupling capacitor C2. Subsequently, the signal Vin transmitted to the gate of the drive transistor Tr2 corresponds to the sum of the threshold voltage Vth that had already been written and the Vsig maintained with a predetermined gain. Further, the pulse is applied to the scan line DS and the switching transistor Tr3 is turned on. Subsequently, the drive transistor Tr2 transmits a drain current to the light-emission element EL according to the input-gate signal Vin so that light emission is started. Therefore, the anode potential of the light-emission element EL increases by as much as ΔV, and the above-described ΔV is added to the input signal Vin for the drive transistor Tr2 due to the bootstrap effect. According to the above-described threshold-voltage cancellation function and bootstrap function, even though the threshold voltage of the drive transistor Tr2 and the characteristic of the light-emission element EL vary, it becomes possible to cancel the variations so that the light-emission brightness is maintained constant.

By the way, a voltage higher than the source is applied to the gate of the drive transistor Tr2 over the single-field period $1f$ so that the gate is forward-biased at all time. Since the forward bias is applied to the gate continuously, the threshold voltage Vth of the drive transistor Tr2 varies upward. The threshold-voltage cancellation circuit 7 can cancel the variation. However, when the variation becomes excessively significant the cancel function becomes insufficient to handle the variation, which may change the brightness of the light-emission element EL. Further, the switching transistor Tr3 is turned on and forward-biased during the light-emission period. Subsequently, the threshold voltage of the switching transistor Tr3 varies upward and at the worst, the switching transistor Tr3 may fall into the cut-off state at all times.

Figure 9:
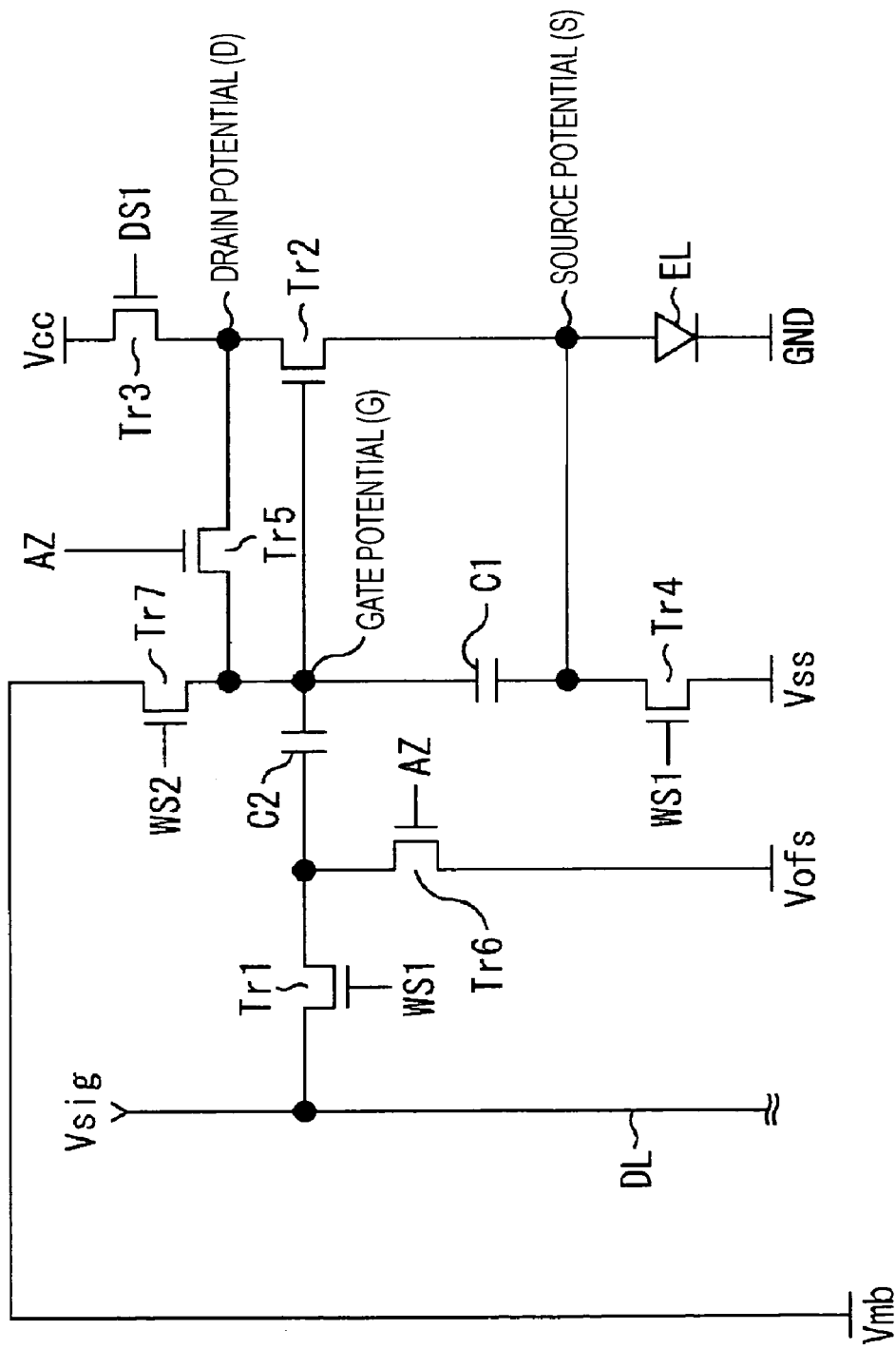
FIG. 9 is a circuit diagram showing a pixel circuit according to a first embodiment of the present invention.

FIG. 9 shows a pixel circuit according to an embodiment of the present invention. For addressing problems of the pixel circuit shown in FIG. 8A, reverse-bias application means adapted to suppress variations in the threshold voltage is provided for each of the drive transistor Tr2 and the switching transistor Tr3.

The reverse-bias application means provided for the drive transistor Tr2 includes a switching transistor Tr7. An additional scan line WS2 is connected to the gate of the transistor Tr7, a negative power Vmb is connected to the source, and the drain is connected to the gate (G) of the drive transistor Tr2. Since the scan timing of the scan line WS2 is different from that of the scan line WS1 connected to the sampling transistor Tr1 and the switching transistor Tr4, the scan lines are divided into the scan lines WS1 and WS2. Here, the potential of the negative power Vmb is set, so as to be lower than the ground potential GND. Therefore, when a selection pulse is applied to the scan line WS2 in such timing that the operation of the pixel circuit is not disturbed, the transistor Tr7 is turned on and the reverse bias (Vmb) can be applied to the gate (G) of the drive transistor Tr2. Subsequently, a forward bias is continuously applied so that the upward-shifted threshold voltage Vth of the transistor Tr2 can be revised downward.

The reverse-bias-application means provided for the switching transistor Tr3 is included in the drive scanner 3 (refer to FIG. 5) connected to the scan line DS1. During the light-emission period, the forward bias is applied to the gate of the switching transistor Tr3 via the scan line DS1 and the drain current flows from the power voltage Vcc toward the ground potential GND. When in the non-light-emission period, the potential of the scan line DS1 becomes lower than the ground potential GND and the reverse bias is applied to the switching transistor Tr3. Subsequently, the upward variations in the threshold voltage of the transistor Tr3 can be revised downward.

Figure 10:
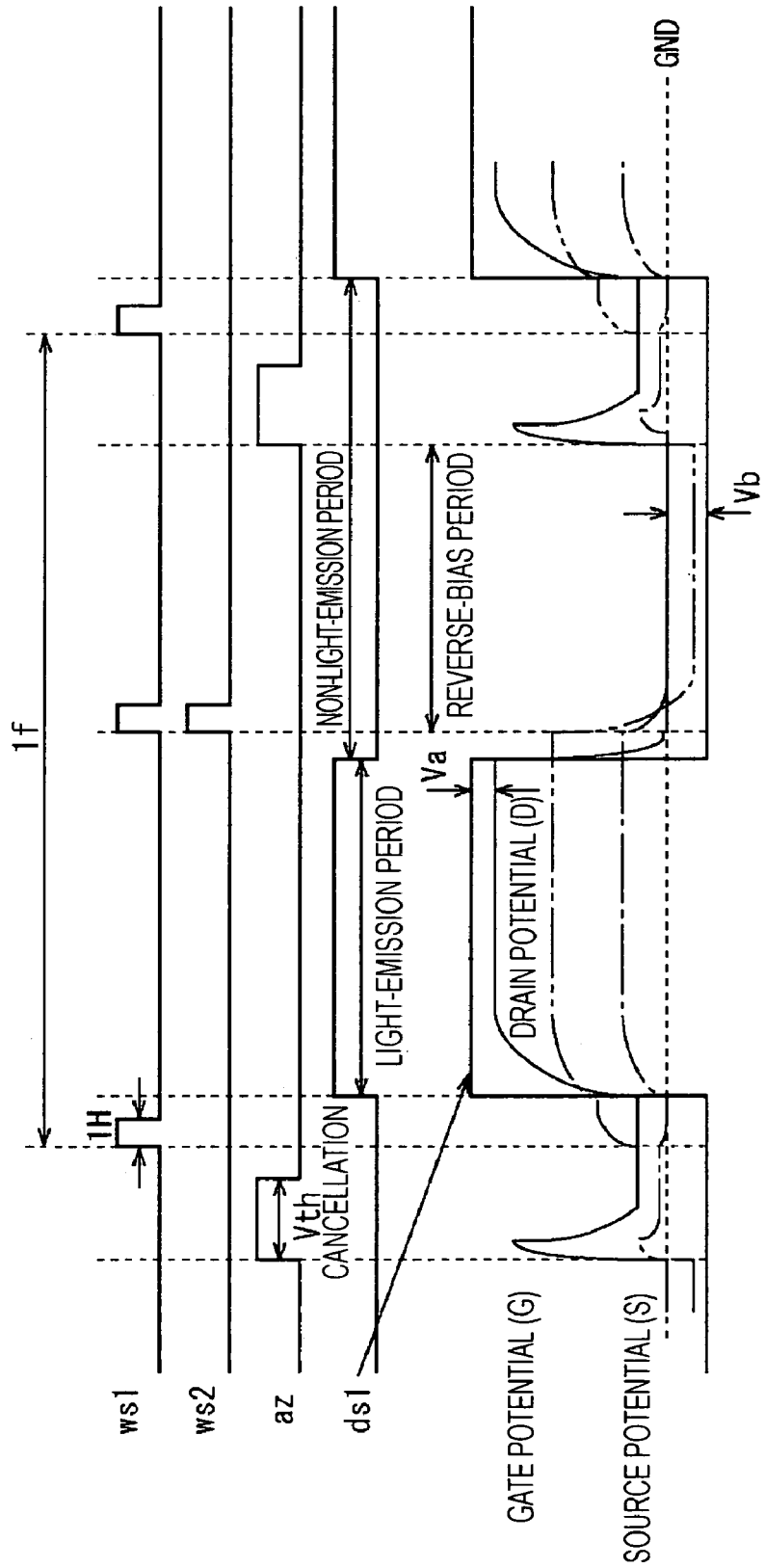
FIG. 10 is a timing chart provided, so as to illustrate operations of the pixel circuit shown in FIG. 9.

FIG. 10 is a timing chart provided for illustrating operations of the pixel circuit shown in FIG. 9. The pulse applied to the scan line WS1 is represented as ws1, the pulse applied to the scan line WS2 is represented as ws2, the pulse applied to the scan line AZ is represented as az, and the pulse applied to the scan line DS1 is represented as ds1. Further, variations in the gate potential (G), the drain potential (D), and the source potential (S) of the drive transistor Tr2 are superimposed on the level change of the pulse ds1. Further, the drain potential (D) of the drive transistor Tr2 also denotes the source potential of the switching transistor Tr3.

During the Vth-cancellation period, the pulse az is applied to the transistors Tr5 and Tr6, and the threshold voltage Vth of the drive transistor Tr2 is detected. The detected threshold voltage Vth is held in the holding capacitor C1, as the difference between the gate potential (G) and source potential (S) of the transistor Tr2. Next, when the pulse ws1 is applied to the sampling transistor Tr1 and the switching transistor Tr4, the video signal Vsig is sampled and written into the holding capacitor C1 via the coupling capacitor C2. The sum of the threshold voltage Vth and the video signal Vsig that are written into the holding capacitor C1 is shown on the timing chart, as the difference between the gate potential (G) and source potential (S) of the transistor Tr2. Further, when the pulse ds1 is applied to the switching transistor Tr3 in the light-emission period, the drain current flows into the light-emission element EL through the drive transistor Tr2, whereby the source potential (S) increases. However, the difference between the source potential (S) and the gate potential (G) is maintained constant due to the bootstrap function. As the source potential (S) increases, the drain potential (D) also increases. The drain potential (D) denotes the source potential of the switching transistor Tr3. However, since the amplitude of the pulse DS1 is set, so as to be sufficiently higher than the drain potential (D), it becomes possible to apply a forward bias Va necessary for the transistor Tr3, so as to perform an on-operation. After that, when the pixel circuit enters the non-light-emission period, the pulse DS1 is changed so that the level thereof becomes low and the transistor Tr3 is cut off. Since the drain current is interrupted, the drain potential (D) of the drive transistor Tr2 is decreased from the Vcc side to the GND. At that time, since the low-level pulse DS1 is set, so as to be lower than the GND, a reverse bias Vb is applied to the gate of the switching transistor Tr3. Further, during the non-light-emission period, the pulse ws2 is applied to transistor Tr7 is brought into conduction and the reverse bias Vmb is applied to the gate (G) of the drive transistor Tr2.

As is clear from the descriptions above, the reverse bias is applied to each of the drive transistor Tr2 and the switching transistor Tr3 in appropriate timing so that variations in the threshold voltage of each of the transistors can be suppressed. However, since the switching transistor Tr3 is susceptible to improvement to some extent, explanations of that matter will be provided. When considering the operation point of the transistor Tr3, the voltage level of the pulse ds1 and the drain voltage (D) of the drive transistor should be considered, as described above. Since the switching transistor Tr3 is turned on during the light-emission period, a potential H of the pulse ds1 is higher than the drain potential (D) by as much as the threshold voltage Vth of the transistor Tr3 and a voltage Va is applied. That is to say, a forward bias is applied between the gate and source of the transistor Tr3 during the light-emission period. After that, when the pixel circuit enters the non-light-emission period, the level L of the pulse DS1 becomes lower than the GND so that a reverse bias is applied. During the reverse-bias period, the drain potential (D) is reduced to the cathode potential (GND) or in the vicinity thereof due to leakage currents or the like. Since the transistor Tr3 is turned off during that period, the reverse bias is applied between the gate and source of the transistor Tr3 by as much as the reverse bias Vb. Therefore, since both the forward bias and the reverse bias are applied to the transistor Tr3, it becomes possible to reduce the variations in the threshold voltage Vth of the transistor Tr3 to a certain extent. However, when the light-emission time included in the single-field period (1f) is increased, the non-light-emission time is squeezed and decreased. Subsequently, the reverse-bias-application time is also decreased, which causes the need for revising the threshold voltage downward with efficiency by as much as the decreased reverse-bias-application time and setting the absolute value of the reverse bias Vb to a high degree. However, when the absolute value of the reverse bias Vb is high, the amplitude of the pulse ds1 increases, which leads to an increased cost. Further, the high absolute value significantly affects the resistance-to-pressure of the transistor Tr3, which affects not only the cost but also the yields.

Figure 11:
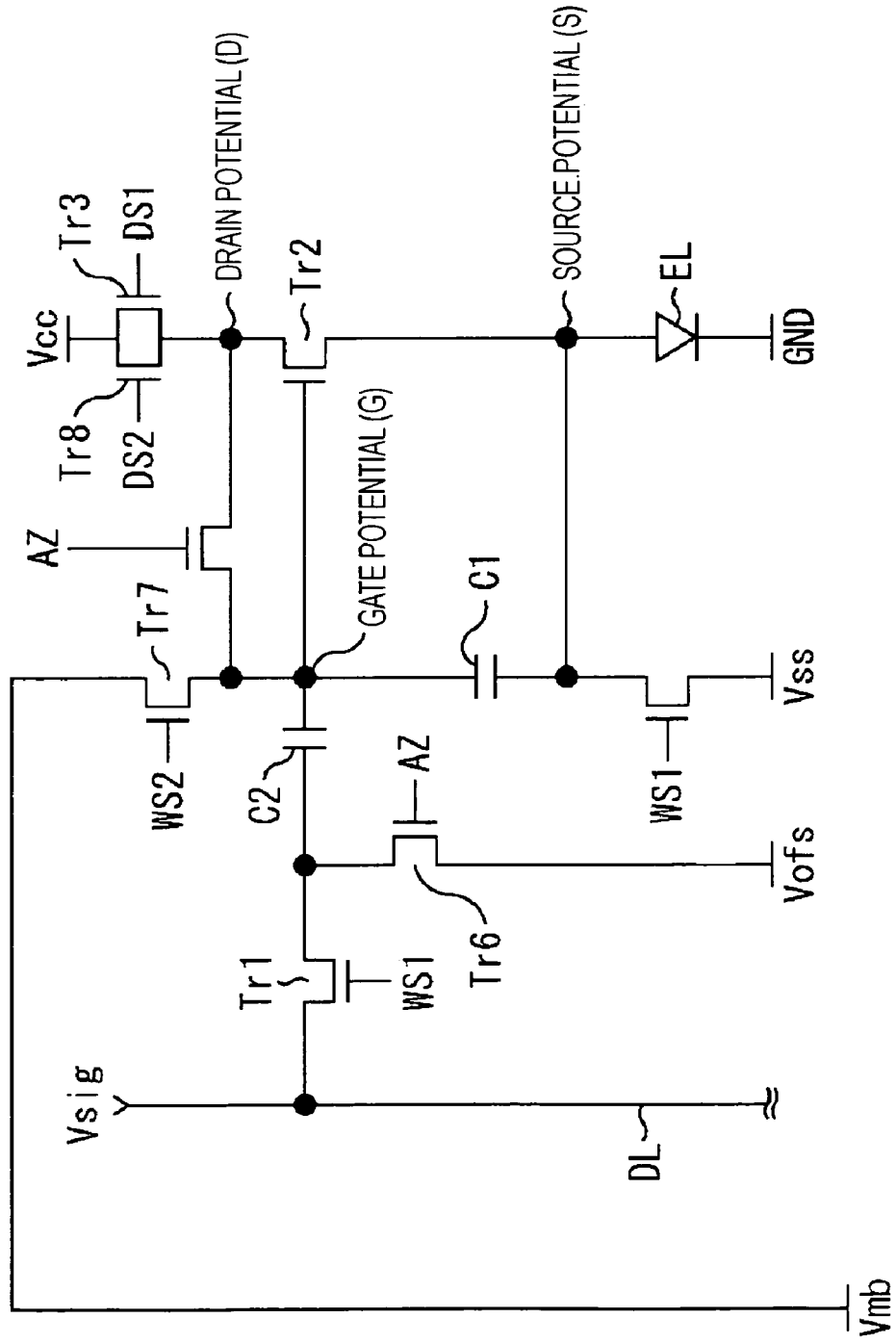
FIG. 11 is a circuit diagram showing a pixel circuit according to a second embodiment of the present invention.

FIG. 11 shows an embodiment achieved by further improving the pixel circuit shown in FIG. 9. For the sake of clarity, parts corresponding to the pixel circuit shown in FIG. 9 are designated by the corresponding reference numbers. As for the improvements, an additional transistor Tr8 is connected in parallel to the problem transistor Tr3 and complement means is connected to the gate of the transistor Tr8 via the scan line DS2. The complement means complementarily drives the additional transistor Tr8 relative to the switching transistor Tr3, so as to generate timing where the operation of the transistor Tr3 is not disturbed. The reverse-bias-application means connected to the switching transistor Tr3 via the scan line DS1 is configured to apply a reverse bias to the transistor Tr3 in the generated timing.

Figure 12:
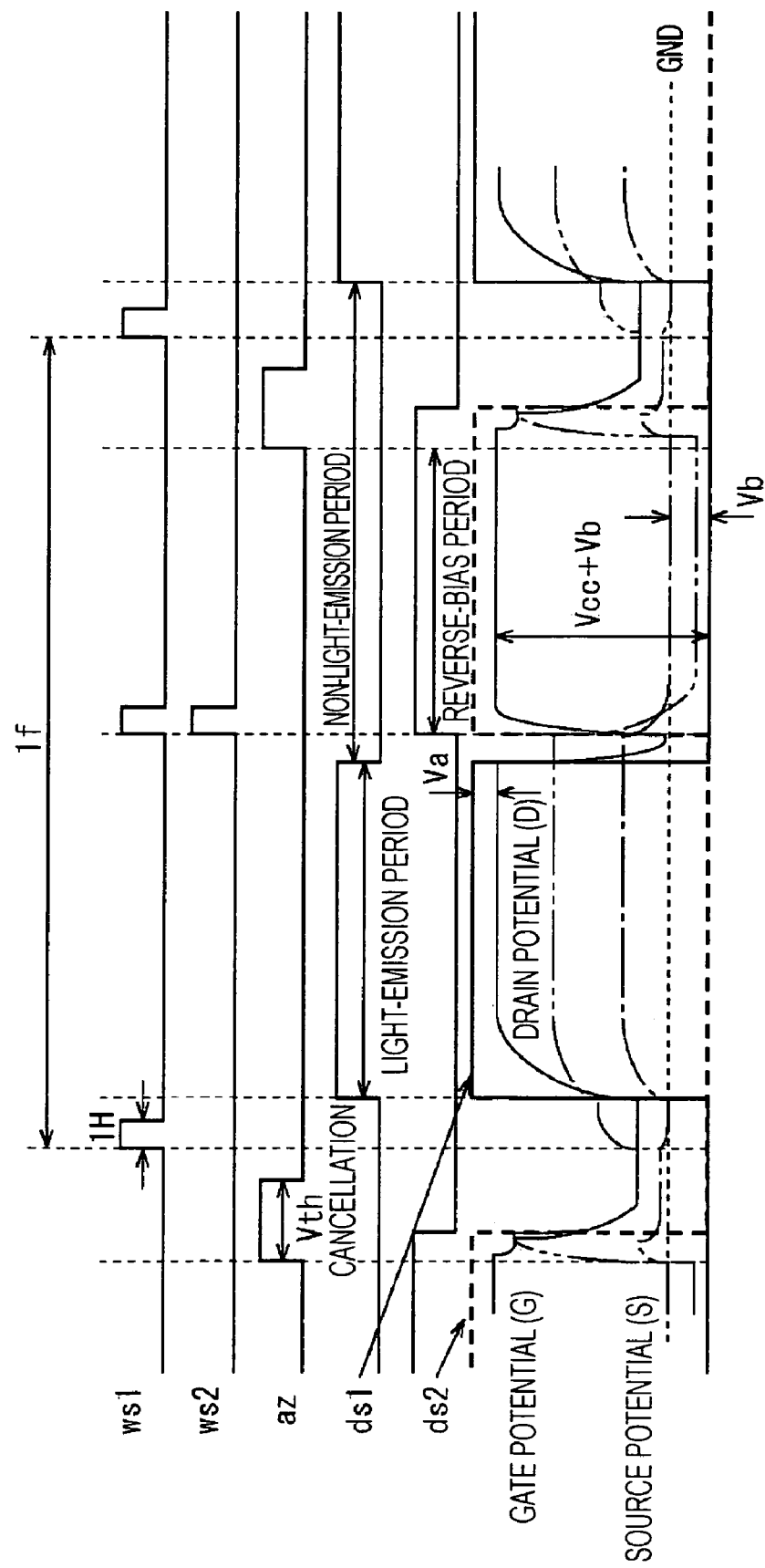
FIG. 12 is a timing chart provided, so as to illustrate operations of the pixel circuit shown in FIG. 11.

FIG. 12 is a timing chart provided for illustrating operations of the pixel circuit shown in FIG. 11. For the sake of clarity, the parts corresponding to the timing chart of the previous embodiment, the timing chart being shown in FIG. 10, are designated by the corresponding reference numbers. As for feature points, the pulse DS1 applied to the gate of the switching transistor Tr3 and the pulse DS2 applied to the gate of the additional transistor Tr8 are opposite to each other in phase. The forward bias Va is applied to the gate of the switching transistor Tr3 during the light-emission period, as is the case with the embodiment shown in FIG. 9. Next, when the pixel circuit enters the non-light-emission period, the pulse DS1 becomes lower than the GND so that the level thereof becomes low and the switching transistor Tr3 is turned off. Since the transistor Tr8 operates complementarily and enters the on state at that time, a current is further transmitted from the power-Vcc side to the drive transistor Tr2. Therefore, the drain potential (D) of the drive transistor Tr2 is not reduced to the cathode potential (GND) and the power potential Vcc and/or a potential in the vicinity thereof can be obtained. Subsequently, during the reverse-bias period included in the non-light-emission period, the absolute value of the voltage between the gate and source of the switching transistor Tr3 is shown as Vcc+Vb so that a significantly high reverse bias can be applied. Therefore, it becomes possible to revise upward variations in the threshold voltage downward with efficiency without applying the pulse DS1 with a large amplitude to the switching transistor Tr3. Thus, since the pixel circuit can accommodate the variations in the threshold voltages of the amorphous silicon thin-film transistor and the polycrystalline silicon thin-film transistor, the brightness of the light-emission element EL is prevented from being deteriorated and a high-quality active-matrix display can be provided. Particularly, since there is no need to increase the amplitude of the pulse applied to the gate of the transistor which performs the on/off control over light emission, a low-cost driver can be achieved. Further, it becomes possible to easily accommodate the variations in the threshold voltage Vth of the switching transistor while accommodating the variations in the threshold voltage Vth of the drive transistor.

INDUSTRIAL APPLICABILITY

When a positive gate voltage (forward bias) is applied to a thin-film transistor repeatedly and/or continuously, the threshold voltage thereof tends to be shifted in the positive direction. On the contrary, when a negative gate voltage (reverse voltage) is applied to the thin-film transistor repeatedly and/or continuously, the threshold voltage thereof tends to be shifted in the negative direction. A transistor circuit may include a thin-film transistor applied with a forward bias between the gate and source thereof repeatedly and/or continuously via circuit wiring according to the functions and/or operation conditions. Due to the forward bias, the threshold voltage of the thin-film transistor is shifted with time. If the shifted threshold voltage is left unaddressed, cut-off operations of the transistor are disturbed, for example, which may cause the transistor circuit to malfunction. In the present invention, therefore, for the thin-film transistor to which the forward bias has to be applied repeatedly and/or continuously in terms of the operations and/or functions of the transistor circuit, the reverse bias is applied in such timing that the operations are not disturbed. Subsequently, it becomes possible to reset the threshold voltage that had been shifted in the positive direction due to the forward bias in the negative direction, so that the variations in the threshold voltage can be suppressed.

In the case of a thin-film transistor to which the forward bias is applied almost continuously, as required, it is often impossible to achieve timing adequate enough to apply the reverse bias. In that case, an additional thin-film transistor is connected in parallel to the thin-film transistor and the additional transistor is driven complementarily relative to the thin-film transistor so that the timing for applying the reverse bias is forcefully generated. Subsequently, in the case of a thin-film transistor of which threshold voltage has to be shifted upward due to continuous forward-bias application, the threshold voltage can be forcefully revised downward by connecting a complementary additional thin-film transistor in parallel to the thin-film transistor.

The invention claimed is:

1. A transistor circuit having a plurality of thin-film transistors formed on a substrate and wiring adapted to connect to a gate, a source, and/or a drain of each of the thin-film transistors, so as to perform a predetermined operation, the transistor circuit comprising:
at least one thin-film transistor applied with a forward bias between a gate and a source repeatedly and/or continuously via wiring during the operation,
reverse-bias-application means configured to suppress a variation in a threshold voltage of the thin-film transistor by applying a reverse bias between the gate and source of the thin-film transistor in such timing that the operation is not disturbed, and
an additional thin-film transistor connected in parallel to the thin-film transistor and complement means which drives the additional thin-film transistor relative to the thin-film transistor, so as to generate timing where the operation is not disturbed,
wherein the reverse-bias-application means applies the reverse bias to the thin-film transistor in the generated timing.

2. A transistor circuit according to claim 1, wherein the thin-film transistor is of an N-channel type and/or a P-channel type, the additional thin-film transistor is of the N-channel type and/or the P-channel type, similarly, and the complement means applies a pulse to a gate of the additional thin-film transistor, the pulse being opposite in phase to a pulse applied to the gate of the thin-film transistor.

3. A transistor circuit according to claim 1, wherein the thin-film transistor is of an N-channel type and/or a P-channel type, the additional thin-film transistor is of the P-channel type and/or the N-channel type, oppositely, and the complement means applies a pulse to the additional thin-film transistor, the pulse being in phase with a pulse applied to the gate of the thin-film transistor.

4. A pixel circuit that is provided at each of intersections of scan lines in rows and scan lines in columns, and that samples a signal from the signal line upon being selected by the scan line and drives a load element according to the sampled signal, the pixel circuit comprising:
a plurality of thin-film transistors formed on a substrate and wiring adapted to connect to a gate, a source, and/or a drain of each of the thin film transistors,
at least one thin-film transistor applied with a forward bias between a gate and a source repeatedly and/or continuously via wiring while the load element is driven,
reverse-bias-application means configured to suppress a variation in a threshold voltage of the thin-film transistor by applying a reverse bias between the gate and source of the thin-film transistor in such timing that the driven load element is not disturbed, and an additional thin-film transistor connected in parallel to the thin-film transistor and complement means which operates the additional thin-film transistor complementarily relative to the thin-film transistor and generates timing where the driven load element is not disturbed, wherein the reverse-bias-application means applies the reverse bias to the thin-film transistor in the generated timing.

5. A pixel circuit according to claim 4, wherein the thin-film transistor is of an N-channel type and/or a P-channel type, the additional thin-film transistor is of the N-channel type and/or the P-channel type, similarly, and the complement means applies a pulse to a gate of the additional thin-film transistor, the pulse being opposite in phase to a pulse applied to the gate of the thin-film transistor.

6. A pixel circuit according to claim 4, wherein the thin-film transistor is of an N-channel type and/or a P-channel type, the additional thin-film transistor is of the P-channel type and/or the N-channel type, oppositely, and the complement means applies a pulse to the additional thin-film transistor, the pulse being in phase with a pulse applied to the gate of the thin-film transistor.

7. A pixel circuit that is provided at each of intersections of scan lines in rows and scan lines in columns, and that samples a signal from the signal line upon being selected by the scan line and drives a load element according to the sampled signal, the pixel circuit comprising:

a plurality of thin-film transistors formed on a substrate and wiring adapted to connect to a gate, a source, and/or a drain of each of the thin film transistors, at least one thin-film transistor applied with a forward bias between a gate and a source repeatedly and/or continuously via wiring while the load element is driven, reverse-bias-application means configured to suppress a variation in a threshold voltage of the thin-film transistor by applying a reverse bias between the gate and source of the thin-film transistor in such timing that the driven load element is not disturbed, wherein the plurality of thin-film transistors includes a sampling thin-film transistor that is brought into conduction upon being selected by the scan line, and that samples a signal from the signal line and holds the sampled signal in a holding capacitor, a drive thin-film transistor which controls the amount of power applied to the load element according to the potential of the signal held in the holding capacitor, and a switching thin-film transistor which performs on/off control of the amount of power applied to the load element, wherein the reverse-bias-application means applies the reverse bias to at least one of the drive thin-film transistor and the switching thin-film transistor, and threshold voltage-cancellation means configured to adjust the level of a signal potential applied to a gate of the drive thin-film transistor, so as to cancel a variation in a threshold voltage of the drive thin-film transistor.

8. A pixel circuit that is provided at each of intersections of scan lines in rows and scan lines in columns, and that samples a signal from the signal line upon being selected by the scan line and drives a load element according to the sampled signal, the pixel circuit comprising:

a plurality of thin-film transistors formed on a substrate and wiring adapted to connect to a gate, a source, and/or a drain of each of the thin film transistors, at least one thin-film transistor applied with a forward bias between a gate and a source repeatedly and/or continuously via wiring while the load element is driven, reverse-bias-application means configured to suppress a variation in a threshold voltage of the thin-film transistor by applying a reverse bias between the gate and source of the thin-film transistor in such timing that the driven load element is not disturbed, wherein the plurality of thin-film transistors includes a sampling thin-film transistor that is brought into conduction upon being selected by the scan line, and that samples a signal from the signal line and holds the sampled signal in a holding capacitor, a drive thin-film transistor which controls the amount of power applied to the load element according to the potential of the signal held in the holding capacitor, and a switching thin-film transistor which performs on/off control of the amount of power applied to the load element, wherein the reverse-bias-application means applies the reverse bias to at least one of the drive thin-film transistor and the switching thin-film transistor, and bootstrap means configured to automatically control the level of a signal potential applied to a gate of the drive thin-film transistor, so as to accommodate a variation in the characteristic of the load element.

9. A display device comprising scan lines in rows, scan lines in columns, and pixel circuits provided at intersections of the scan lines, wherein, upon being selected by the scan line, the pixel circuit samples a video signal from the signal line and drives a light-emission element according to the sampled video signal, and wherein the pixel circuit includes a plurality of thin-film transistors formed on a substrate and wiring adapted to connect to a gate, a source, and/or a drain of each of the thin-film transistors, at least one thin-film transistor applied with a forward bias between a gate and a source repeatedly and/or continuously via wiring while the light-emission element is driven, reverse-bias-application means configured to suppress a variation in a threshold voltage of the thin-film transistor by applying a reverse bias between the gate and source of the thin-film transistor in such timing that the driven light-emission element is not disturbed, and an additional thin-film transistor connected in parallel to the thin-film transistor and complement means which operates the additional thin-film transistor complementarily relative to the thin-film transistor and generates timing where the driven light-emission element is not disturbed, wherein the reverse-bias-application means applies the reverse bias to the thin-film transistor in the generated timing.

10. A display device according to claim 9, wherein the thin-film transistor is of an N-channel type and/or a P-channel type, the additional thin-film transistor is of the N-channel type and/or the P-channel type, similarly, and the complement means applies a pulse to a gate of the additional thin-film transistor, the pulse being opposite in phase to a pulse applied to the gate of the thin-film transistor.

11. A display device according to claim 9, wherein the thin-film transistor is of an N-channel type and/or a P-channel type, the additional thin-film transistor is of the P-channel type and/or the N-channel type, oppositely, and the complement means applies a pulse to the additional thin-film transistor, the pulse being in phase with a pulse applied to the gate of the thin-film transistor.

12. A display device according to claim 9, wherein the plurality of thin-film transistors includes a sampling thin-film transistor that is brought into conduction upon being selected by the scan line, and that samples a video signal from the signal line and holds the sampled video signal in a holding capacitor, a drive thin-film transistor which controls the amount of power applied to the light-emission element according to the potential of the signal held in the holding capacitor, and a switching thin-film transistor which performs on/off control of the amount of power applied to the light-emission element, wherein the reverse-bias-application means applies the reverse bias to at least one of the drive thin-film transistor and the switching thin-film transistor.

13. A display device comprising scan lines in rows, scan lines in columns, and pixel circuits provided at intersections of the scan lines,
wherein, upon being selected by the scan line, the pixel circuit samples a video signal from the signal line and drives a light-emission element according to the sampled video signal, and
wherein the pixel circuit includes a plurality of thin-film transistors formed on a substrate and wiring adapted to connect to a gate, a source, and/or a drain of each of the thin-film transistors,
at least one thin-film transistor applied with a forward bias between a gate and a source repeatedly and/or continuously via wiring while the light-emission element is driven, and
reverse-bias-application means configured to suppress a variation in a threshold voltage of the thin-film transistor by applying a reverse bias between the gate and source of the thin-film transistor in such timing that the driven light-emission element is not disturbed,
wherein the plurality of thin-film transistors includes a sampling thin-film transistor that is brought into conduction upon being selected by the scan line, and that samples a video signal from the signal line and holds the sampled video signal in a holding capacitor, a drive thin-film transistor which controls the amount of power applied to the light-emission element according to the potential of the signal held in the holding capacitor, and a switching thin-film transistor which performs on/off control of the amount of power applied to the light-emission element, wherein the reverse-bias-application means applies the reverse bias to at least one of the drive thin-film transistor and the switching thin-film transistor, and
threshold voltage-cancellation means configured to adjust the level of a signal potential applied to a gate of the drive thin-film transistor, so as to cancel a variation in a threshold voltage of the drive thin-film transistor.

14. A display device comprising scan lines in rows, scan lines in columns, and pixel circuits provided at intersections of the scan lines,
wherein, upon being selected by the scan line, the pixel circuit samples a video signal from the signal line and drives a light-emission element according to the sampled video signal, and
wherein the pixel circuit includes a plurality of thin-film transistors formed on a substrate and wiring adapted to connect to a gate, a source, and/or a drain of each of the thin-film transistors,
at least one thin-film transistor applied with a forward bias between a gate and a source repeatedly and/or continuously via wiring while the light-emission element is driven, and
reverse-bias-application means configured to suppress a variation in a threshold voltage of the thin-film transistor by applying a reverse bias between the gate and source of the thin-film transistor in such timing that the driven light-emission element is not disturbed,
wherein the plurality of thin-film transistors includes a sampling thin-film transistor that is brought into conduction upon being selected by the scan line, and that samples a video signal from the signal line and holds the sampled video signal in a holding capacitor, a drive thin-film transistor which controls the amount of power applied to the light-emission element according to the potential of the signal held in the holding capacitor, and a switching thin-film transistor which performs on/off control of the amount of power applied to the light-emission element, wherein the reverse-bias-application means applies the reverse bias to at least one of the drive thin-film transistor and the switching thin-film transistor, and
bootstrap means configured to automatically control the level of a signal potential applied to a gate of the drive thin-film transistor, so as to accommodate a variation in the characteristic of the load element.

15. A method of driving a transistor circuit including a plurality of thin-film transistors formed on a substrate and wiring adapted to connect to a gate, a source, and/or a drain of each of the thin-film transistors, so as to perform a predetermined operation, the driving method being adapted to perform:
a forward bias-application step adapted to apply a forward bias between the gate and the source of at least one of the thin film transistors repeatedly and/or continuously via the wiring during the operation,
a reverse bias-application step adapted to suppress a variation in a threshold voltage of the thin-film transistor by applying a reverse bias between the gate and source of the thin-film transistor in such timing that the operation is not disturbed, and
a complement step adapted to drive an additional thin-film transistor connected in parallel to the thin-film transistor complementarily relative to the thin-film transistor, thereby generating timing where the operation is not disturbed,
wherein the reverse bias-application step is adapted to apply the reverse bias to the thin-film transistor in the generated timing.

16. A method of driving a pixel circuit that is provided at each of intersections of scan lines in rows and scan lines in columns, and that includes a plurality of thin-film transistors formed on a substrate and wiring adapted to connect to a gate, a source, and/or a drain of each of the thin-film transistors, so as to sample a signal from the signal line upon being selected by the scan line and drive a load element according to the sampled signal, the driving method being adapted to perform:
a forward bias-application step adapted to apply a forward bias between the gate and the source of at least one of the thin film transistors repeatedly and/or continuously via the wiring while the load element is driven, and
a reverse bias-application step adapted to suppress a variation in a threshold voltage of the thin-film transistor by applying a reverse bias between the gate and source of the thin-film transistor in such timing that the driven load element is not disturbed a complement step adapted to operate an additional thin-film transistor connected in parallel to the thin-film transistor complementarily relative to the thin-film transistor, thereby generating timing where the driven load element is not disturbed, wherein the reverse bias-application step is adapted to apply the reverse bias to the thin-film transistor in the generated timing.

17. A method of driving a display device comprising scan lines in rows, scan lines in columns, and pixel circuits provided at intersections of the scan lines, wherein, upon being selected by the scan line, the pixel circuit samples a video signal from the signal line and drives a light-emission element according to the sampled video signal, and wherein the pixel circuit includes a plurality of thin-film transistors formed on a substrate and wiring adapted to connect to a gate, a source, and/or a drain of each of the thin-film transistors, the driving method being adapted to perform:

a forward bias-application step adapted to apply a forward bias between the gate and the source of at least one of the thin-film transistors repeatedly and/or continuously via the wiring while the light-emission element is driven, a reverse bias-application step adapted to suppress a variation in a threshold voltage of the thin-film transistor by applying a reverse bias between the gate and source of the thin-film transistor in such timing that the driven light-emission element is not disturbed, and a complement step adapted to operate an additional thin-film transistor connected in parallel to the thin-film transistor complementarily relative to the thin-film transistor, thereby generating timing where the driven light-emission element is not disturbed, wherein the reverse bias-application step is adapted to apply the reverse bias to the thin-film transistor in the generated timing.

* * * * *